(12) United States Patent
Ayati et al.

(10) Patent No.: US 11,641,155 B2
(45) Date of Patent: May 2, 2023

(54) ADAPTIVE HARMONIC CANCELLATION

(71) Applicant: QUALCOMM Incorporated, San Diego, CA (US)

(72) Inventors: Seyyed Amir Ayati, Bellevue, WA (US); Noshir Dubash, Phoenix, AZ (US); Zaid Aboush, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 565 days.

(21) Appl. No.: 16/855,572

(22) Filed: Apr. 22, 2020

(65) Prior Publication Data

US 2021/0336526 A1    Oct. 28, 2021

(51) Int. Cl.
    *H02M 1/12*    (2006.01)
(52) U.S. Cl.
    CPC ..................... *H02M 1/12* (2013.01)
(58) Field of Classification Search
    CPC ........................................... H02M 1/12
    See application file for complete search history.

(56) References Cited

U.S. PATENT DOCUMENTS

| | | | |
|---|---|---|---|
| 9,960,608 B2 | 5/2018 | Irish et al. | |
| 10,171,034 B2 | 1/2019 | Tseng et al. | |
| 2015/0180685 A1* | 6/2015 | Noest | H04B 1/40 375/219 |
| 2019/0207565 A1* | 7/2019 | de Vreede | H04B 1/0483 |
| 2020/0220756 A1* | 7/2020 | Pan | H03F 3/21 |
| 2020/0251912 A1* | 8/2020 | Dvorsky | H02J 50/80 |

FOREIGN PATENT DOCUMENTS

CN    206422684 U    8/2017

OTHER PUBLICATIONS

Ba A., et al., "A 2.4GHz Class-D Power Amplifier with Conduction Angle Calibration for -50dBc Harmonic Emissions", 2014 IEEE Radio Frequency Integrated Circuits Symposium, pp. 239-242.

(Continued)

*Primary Examiner* — Jared Fureman
*Assistant Examiner* — Esayas G Yeshaw
(74) *Attorney, Agent, or Firm* — Patterson + Sheridan, L.L.P.

(57) ABSTRACT

Certain aspects of the present disclosure provide apparatus and techniques for wireless communication implemented with harmonic cancellation. One example implementation includes a polar transmitter having at least one amplifier having an input configured to receive a phase-modulated signal to be amplified based on an amplitude-modulated signal, a harmonic cancellation circuit coupled to the input of the at least one amplifier, the harmonic cancellation circuit being configured to cancel at least one of an even harmonic or an odd harmonic of a transmission signal at an output of the polar transmitter, a controller having an output coupled to one or more control inputs of the harmonic cancellation circuit, and a feedback path between an output of the at least one amplifier and an input of the controller.

30 Claims, 9 Drawing Sheets

(56) References Cited

OTHER PUBLICATIONS

Chen Y-H., et al., "An LTE SAW-Less Transmitter Using 33% Duty-Cycle LO Signals for Harmonic Suppression," Solid-State Circuits Conference Digest of Technical Papers (ISSCC), 2015 IEEE International, session 9, 9.7, pp. 172-174, Retrieved from the Internet: URL: http://ieeexplore.ieee.org/stamp/stamp.jsp?tp=&arnumber=7062981.
Peng X., et al., "Digital Harmonic Canceling Algorithm for Power Amplifiers Based on Nonlinear Adaptive Filter", 2018, Progress in Electromagnetics Research M, vol. 65, pp. 151-164.
Ramakrishnan S., "Design of Integrated Full-Duplex Wireless Transceivers", May 1, 2017, Technical Report No. UCB/EECS-2017-24, Retrieved from the Internet: http://www2.eecs.berkeley.edu/Pubs/TechRpts/2017/EECS-2017-24.html, 153 pages.

* cited by examiner

ADAPTIVE HARMONIC CANCELLATION

FIELD OF THE DISCLOSURE

Certain aspects of the present disclosure generally relate to electronic circuits and, more particularly, to methods and apparatus for harmonic cancellation in wireless systems.

DESCRIPTION OF RELATED ART

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. In certain aspects, multiple mobile stations may be communicate with each other using various communication protocols such as Bluetooth (BT), or BT Low Energy (BLE).

At least one of these transmitters may be implemented as a polar transmitter. A polar transmitter may assist a power amplifier in radio frequency (RF) front-end circuitry to exhibit better performance. In the polar structure, in-phase/quadrature (I/Q) signals are polarized into magnitude and phase signals. The magnitude and phase signals are then used to generate signals for transmission via the power amplifier.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide apparatus and techniques for wireless communication implemented with harmonic cancellation.

Certain aspects are directed to a polar transmitter. The polar transmitter generally includes at least one amplifier having an input configured to receive a phase-modulated signal to be amplified based on an amplitude-modulated signal, a harmonic cancellation circuit coupled to the input of the at least one amplifier, the harmonic cancellation circuit being configured to cancel at least one of an even harmonic or an odd harmonic of a transmission signal at an output of the at least one amplifier, a controller having an output coupled to one or more control inputs of the harmonic cancellation circuit, and a feedback path between the output of the at least one amplifier and an input of the controller.

Certain aspects are directed to a polar transmitter. The polar transmitter generally includes a first amplifier, a second amplifier, each of the first amplifier and the second amplifier having an input configured to receive a phase-modulated signal to be amplified based on an amplitude-modulated signal. The polar transmitter may also include a harmonic cancellation circuit configured to cancel an odd harmonic of a transmission signal at an output of the polar transmitter, the harmonic cancellation circuit. The harmonic cancellation circuit generally includes a duty cycle control circuit coupled to the input of the first amplifier and a variable delay circuit coupled between an output of the duty cycle control circuit and an input of the second amplifier.

Certain aspects are directed to a method for wireless communication. The method generally includes determining a power of a harmonic of a transmission signal at an output of a polar transmitter, and adjusting one or more parameters of a harmonic cancellation circuit coupled to an input of at least one amplifier of the polar transmitter, the one or more parameters being adjusted based on the power of the harmonic of the transmission signal.

Certain aspects are directed to an apparatus for wireless communication. The apparatus generally includes means for determining a power of a harmonic component of a transmission signal at an output of a polar transmitter, and means for adjusting one or more parameters of a harmonic cancellation circuit coupled to an input of a means for amplifying of the polar transmitter, the one or more parameters being adjusted based on the power of the harmonic component.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
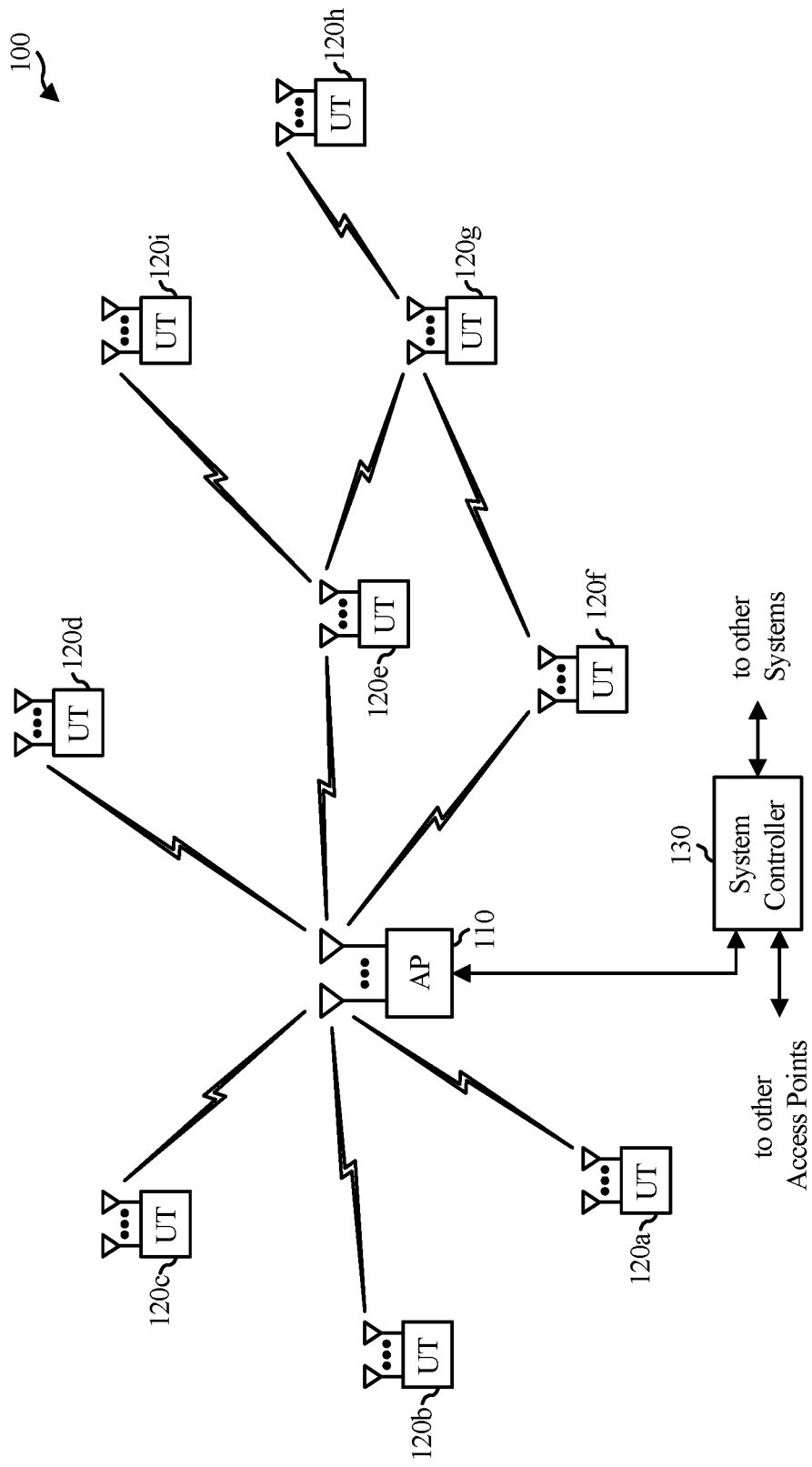
FIG. 1 illustrates a wireless communications system with access points and user terminals, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, wireless earbud, smartwatch, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points. A system controller may not be used for certain communication protocols such as Bluetooth (BT) or BT Low Energy (BLE).

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The Nu selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more harmonic cancellation circuits, as described in more detail herein.

Figure 2:
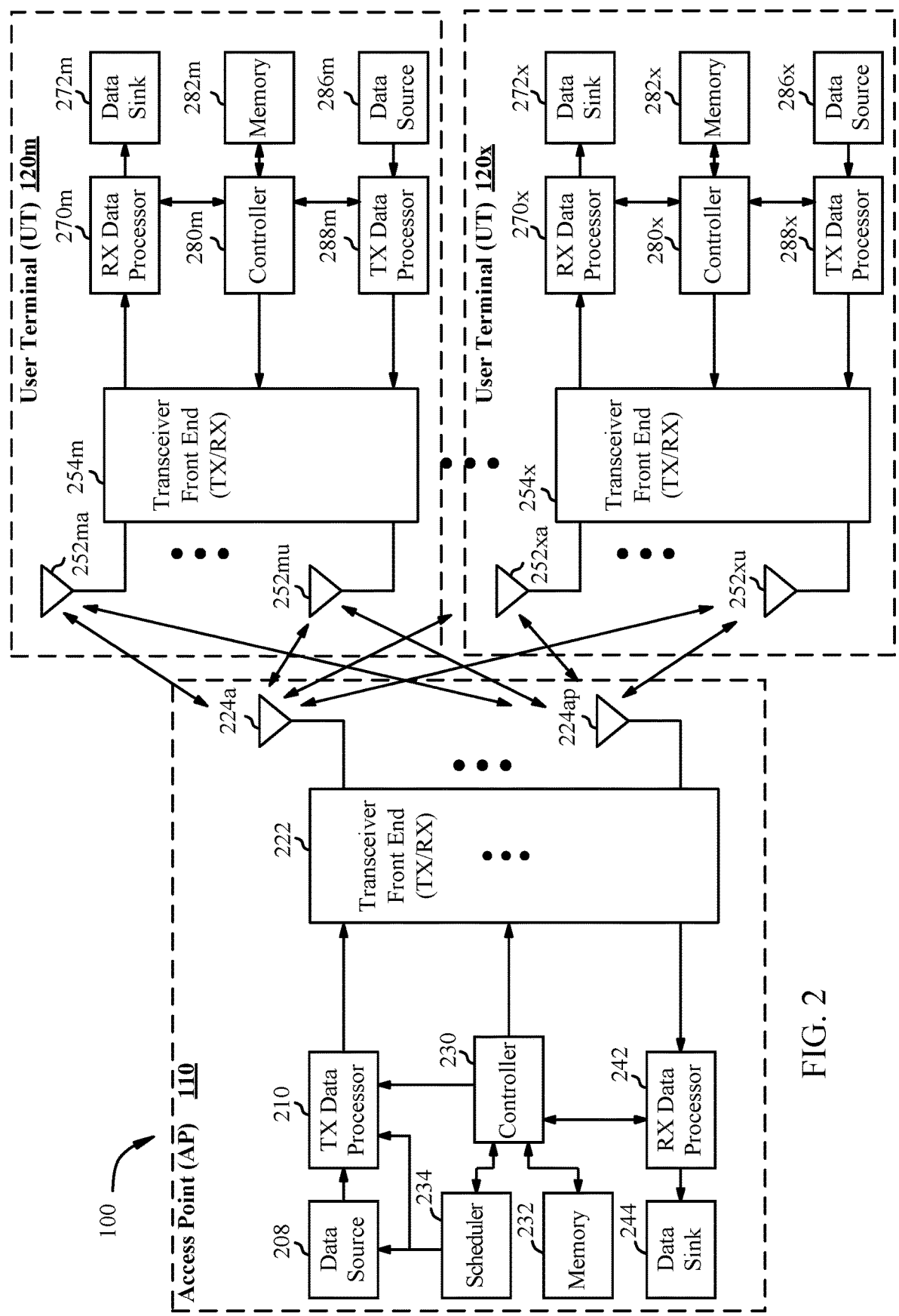
FIG. 2 is a block diagram illustrating an access point and two user terminals of a wireless system, in which aspects of the present disclosure may be practiced.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front-end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280. Furthermore, the UTs 120m, 120x may also communicate directly with each other using communication protocols such as BT or BLE.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include one or more harmonic cancellation circuits, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, Nut,m antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
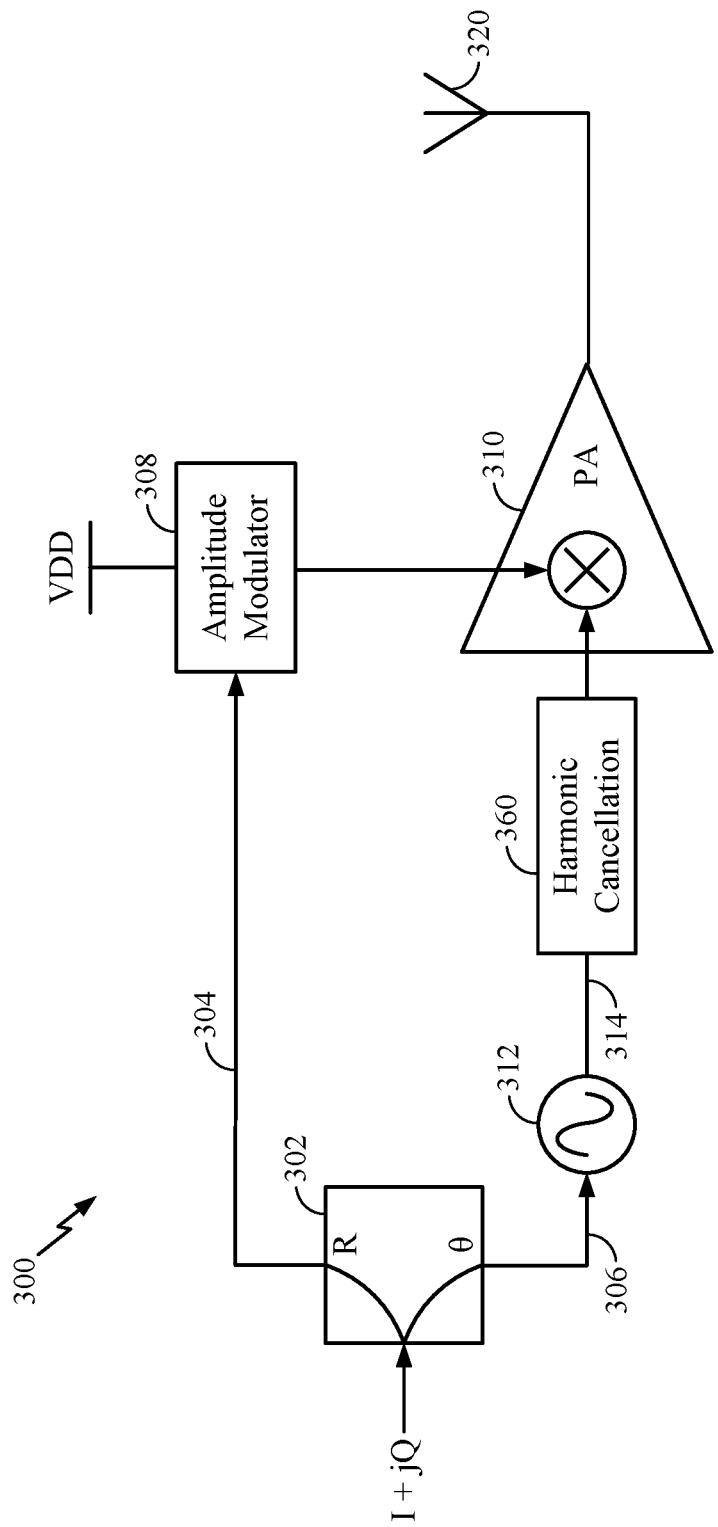
FIG. 3 is a block diagram of an example polar transmitter, in which aspects of the present disclosure may be practiced.

FIG. 3 is an example polar transmitter 300, which may be implemented in a transceiver front end, such as transceiver front ends 222, 254 in FIG. 2, in accordance with certain aspects of the present disclosure. The transceiver front end may include a baseband module for generating a baseband signal having in-phase (I) and quadrature (Q) components (I+jQ). The baseband signal may be provided to a polar processor 302 which may generate a magnitude signal 304 and a phase signal 306, as illustrated.

The magnitude signal 304 (also referred to as an amplitude component) is provided to an amplitude modulator (AM) circuit 308. The AM circuit 308 generates a magnitude control signal (e.g., AM signal) to be provided to a power amplifier (PA) 310. The phase signal 306 is provided to a phase modulator, which may be implemented as a phase-locked loop (PLL) 312 having a voltage-controlled oscillator (VCO), for example. The PLL 312 generates a radio-frequency (RF) signal 314 that is amplified by the PA 310 to generate an amplified signal at the output of the PA 310 coupled to the antenna 320. In certain aspects, a harmonic cancellation circuit 360 may be implemented at the input of the PA 310, as described in more detail herein.

Example Adaptive Harmonic Cancellation Techniques

By nature, power amplifiers in transmitters are nonlinear and generate higher harmonics of a transmission signal. Keeping the power level of these harmonics below the Federal Communications Commission (FCC) standards for harmonic power is one of the challenges in designing transmitters. Passive filters have been added between power amplifiers and antennas to filter these harmonics; however, there are several issues in using these filters to reject the harmonics. Adding a filter to reject transmitter harmonics reduces the efficiency of the transmitter. Moreover, signal gain associated with the transmitter may be increased to compensate for the effect of the passive filter, resulting in increased power consumption. In low-power applications, such as earbuds and wearables, low power consumption and battery life are important. By removing the passive filter, power consumption may be decreased, and battery life may be improved. In addition, a passive filter adds to the area consumption of front-end circuitry and increases the cost of a wireless device.

Certain aspects of the present disclosure are directed to a transmitter implementation with relatively low harmonic power, allowing a wireless device to be implemented without the passive filter at the transmitter output. In addition to reducing power consumption, area, and cost, reducing the power of harmonic signals solves various other issues with multiband wireless standards such as WiFi. For example, in WiFi, two frequency bands, 2.4 GHz and 5 GHz, are used, and the second harmonic of a power amplifier at 2.4 GHz band may interfere with the 5 GHz band. Thus, by reducing the power of harmonics, the interference to other bands may be reduced.

The aspects described herein may be applied to any polar transceiver, including Bluetooth®, Bluetooth low energy (BLE), WiFi, and Zigbee, to reduce or eliminate filters used in the platform for attenuation of harmonics. Certain aspects of the present disclosure provide techniques for attenuating harmonics of a transmission signal by adjusting parameters of delay elements and duty cycle control elements in an input path of a power amplifier.

Figure 4:
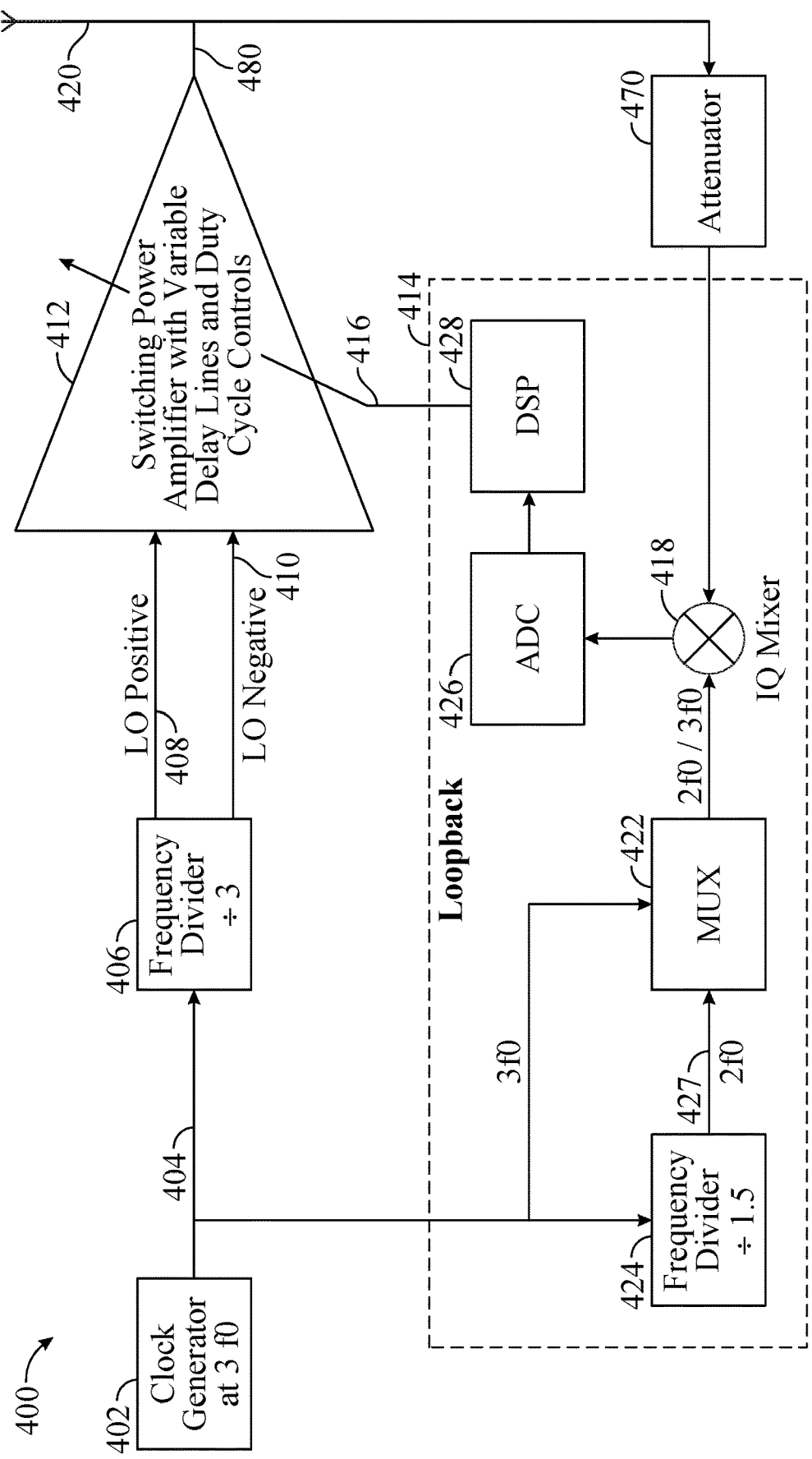
FIG. 4 illustrates a polar transmitter implemented using loopback circuitry for reducing harmonics, in accordance with certain aspects of the present disclosure.

FIG. 4 illustrates a polar transmitter 400 implemented using loopback circuitry for reducing harmonics, in accordance with certain aspects of the present disclosure. As illustrated, the polar transmitter 400 may include a clock generator 402 (e.g., corresponding to PLL 312 of FIG. 3) that generates a clock signal 404 at an input node of the polar transmitter having a frequency that is three times the fundamental frequency $f_0$ of the polar transmitter. In certain applications, the clock generator 402 may include a phase-locked loop (PLL) synthesizer. In certain implementations, a ring oscillator may be used to generate the clock signal 404.

A frequency divider 406 may be used to divide the frequency of the clock signal 404 and generate positive and negative local oscillator (LO) signals 408, 410 that are input to an amplification circuit 412. In certain aspects, the amplification circuit 412 may be include a switching power amplifier (PA), as described in more detail herein.

In a polar transmitter, a switching PA may be used, and the RF input signal of the PA may be a phase-modulated square wave clock. Depending on the class of the switching PA, a square wave voltage or current at the output of the PA may be generated. This square wave voltage or current at the PA output may be the source of odd harmonics at the PA output. In certain aspects, the amplification circuit 412 may be implemented using a variable delay lines (also referred to as delay circuits) and duty cycle control circuitry for reducing harmonics, as described in more detail herein.

In certain aspects, loopback circuitry 414 may be implemented in a feedback path between the output of the amplification circuit 412 and at least one control input 416 to the amplification circuit 412. The loopback circuitry 414 may sense (e.g., estimate) the power of harmonics at the output of the amplification circuit 412 (e.g., power of harmonics of a transmission signal 480), and adjust parameters of the amplification circuit 412 to reduce the harmonics.

In certain implementations, the loopback circuitry 414 may include an in-phase (I) and quadrature (Q) (IQ) mixer 418 configured to sense the power of the harmonics at the output of the amplification circuit 412. A radio frequency (RF) feedback signal (e.g., the transmission signal 480) may be fed back to the IQ mixer 418, which downconverts the RF feedback signal to a baseband signal, the baseband signal representing the harmonic of the transmission signal 480.

As an example, the baseband signal may represent a second harmonic or a third harmonic of the transmission signal at the output of the amplification circuit 412, depending on an output of a multiplexer (MUX) 422. In other words, the IQ mixer 418 downconverts the second or third harmonics of the transmission signal 480 to a baseband frequency, which may then be converted from the analog domain to the digital domain for further processing by a controller, as described herein. In case the clock signal 404 is an unmodulated clock, the IQ mixer 418 may mix the second or third harmonic of the transmission signal 480 with a replica of itself, resulting in a direct-current (DC) signal at the input of ADC 426.

In certain aspects, the clock signal 404 may be input to the MUX 422. The clock signal 404 may also be frequency divided by 1.5 by a frequency divider 424. Thus, the output of the frequency divider 424 may be a frequency-divided clock signal 427 having a frequency of $2f_0$, which is also input to the MUX 422. One of the clock signals 404, 427 may be selected by the MUX 422 and provided as an LO signal to the IQ mixer 418. Depending on the LO signal provided to the IQ mixer 418, the baseband signal generated by the IQ mixer 418 represents one of the second and third harmonics of the transmission signal 480. That is, if the clock signal 404 at $3f_0$ is provided as the LO of the IQ mixer 418, the output of the IQ mixer 418 may represent the third harmonic of the transmission signal 480, and if the clock signal 427 is provided as the LO of the IQ mixer 418, the output of the IQ mixer 418 may represent the second harmonic of the transmission signal 480. The mixer 418 is implemented as an IQ mixer in order for the sensing of the harmonics to be independent from phase variations between the PA output and the mixer's LO. In certain aspects, an attenuator 470 may be used to attenuate the transmission signal 480 before being input to the IQ mixer 418, as illustrated.

The downconverted signal at the output of the IQ mixer 418 may be converted from the analog domain to the digital domain via an analog-to-digital converter (ADC) 426 for further processing in the digital domain. For example, the ADC output may be processed by a DSP 428 (and/or firmware), to calculate the power of the downconverted signal, based on which parameters of the amplification circuit 412 may be adjusted. For example, the power of the harmonics may be reduced by tuning variable delay lines and/or variable duty cycle control circuits of the amplification circuit 412, as described in more detail herein.

Figure 5:
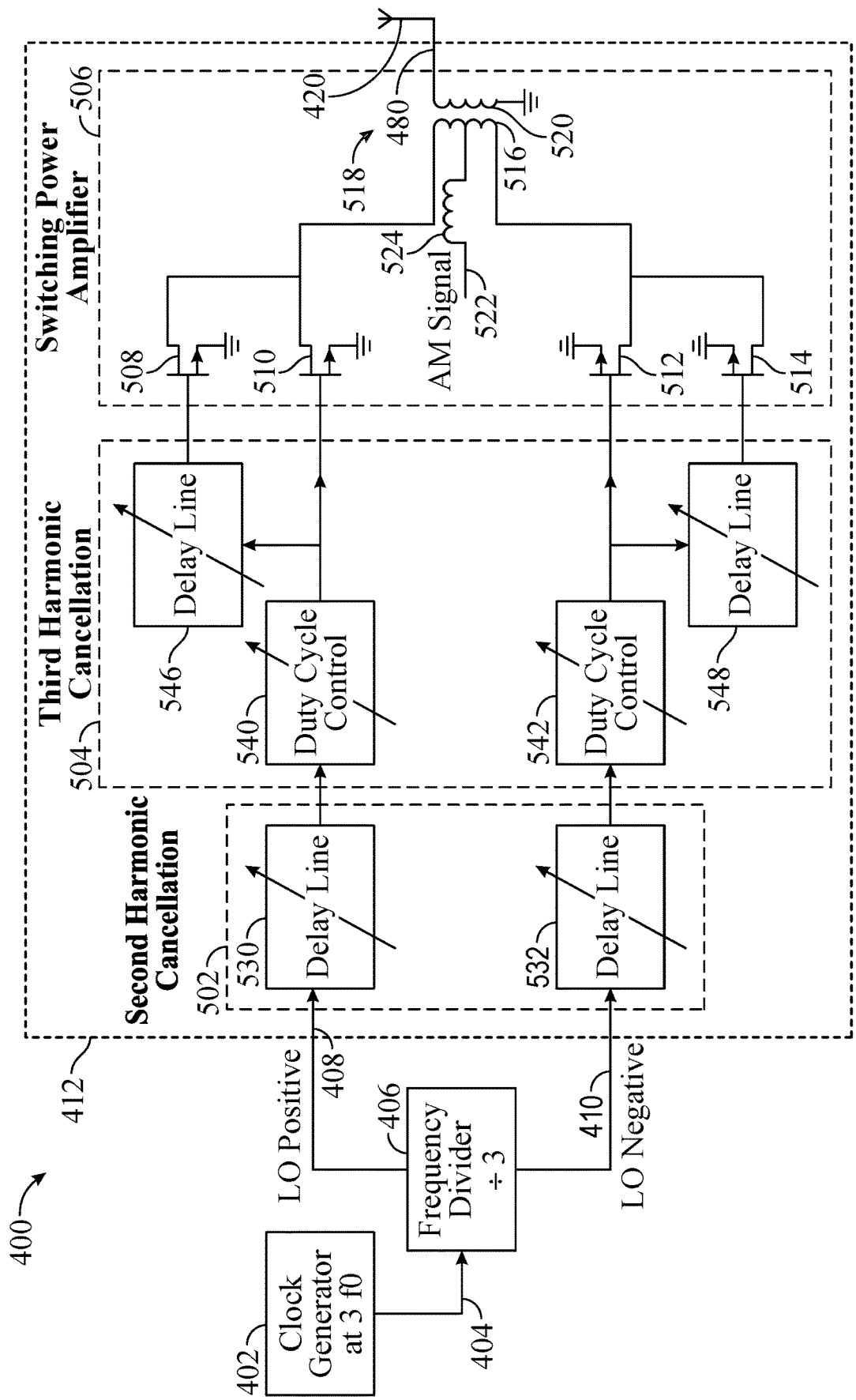
FIG. 5 illustrates a polar transmitter implemented with a switching amplifier coupled to second and third harmonic cancellation circuits, in accordance with certain aspects of the present disclosure.

FIG. 5 illustrates the polar transmitter 400 implemented with a switching PA 506 coupled to second and third harmonic cancellation circuits 502, 504, in accordance with certain aspects of the present disclosure. The switching PA 506 may include amplifier implemented using transistors 508, 510, 512, 514 (e.g., n-type metal-oxide- semiconductor (NMOS) transistors). For example, each of the transistors 508, 510, 512, 514 may implement an amplifier, the gate of each transistor being an input of the amplifier and the drain of each transistor being an output of the amplifier. Moreover, transistors 510, 512 may implement a differential amplifier, the gate of transistor 510 being a positive input terminal of the differential amplifier, the gate of transistor 512 being a negative input terminal of the differential amplifier, the drain of the transistor 510 being a positive output terminal of the differential amplifier, and the drain of the transistors 512 being a negative output terminal of the differential amplifier. The sources of the transistors 508, 510, 512, 514 are coupled to a reference potential node (e.g., electric ground). The drains of the transistors 508, 510 are coupled to a first terminal of a primary winding 516 of a transformer 518, the secondary winding 520 of the transformer 518 being coupled between the reference potential node and the antenna 420. The drains of the transistors 512, 514 are coupled to a second terminal of the primary winding 516 of the transformer 518. As illustrated, an amplitude modulation (AM) signal 522 (e.g., from AM circuit 308) may be provided to a tap of the primary winding through, for example, an inductive element 524.

As described herein, odd and even harmonics at the output of the PA 506 may be generated that may cause interference to other bands or result in failure of FCC standards. In certain aspects, a second harmonic cancellation circuit 502 may be coupled to the output of the frequency divider 406. The frequency divider 406 divides the clock signal 404 by three to generate positive and negative LO signals 408, 410. The second harmonic cancellation circuit 502 may include variable delay circuits 530, 532 (e.g., also referred to as delay lines) that add an intentional delay difference between the positive and negative LO signals to be provided to the PA 506. This delay may be tuned in a closed loop system to reduce the power of the second harmonic generated at the PA output, as described in more detail herein.

The third harmonic cancellation circuit 504 includes duty cycle control circuits 540, 542 in the positive and negative LO paths, respectively. The outputs of the duty cycle control circuits 540, 542 are coupled to the gates of respective transistors 510, 512. The third harmonic cancellation circuit 504 also includes variable delay circuits 546, 548 coupled between the respective outputs of the duty cycle control circuits 540, 542 and respective gates of transistors 508, 514, as illustrated.

Figure 6:
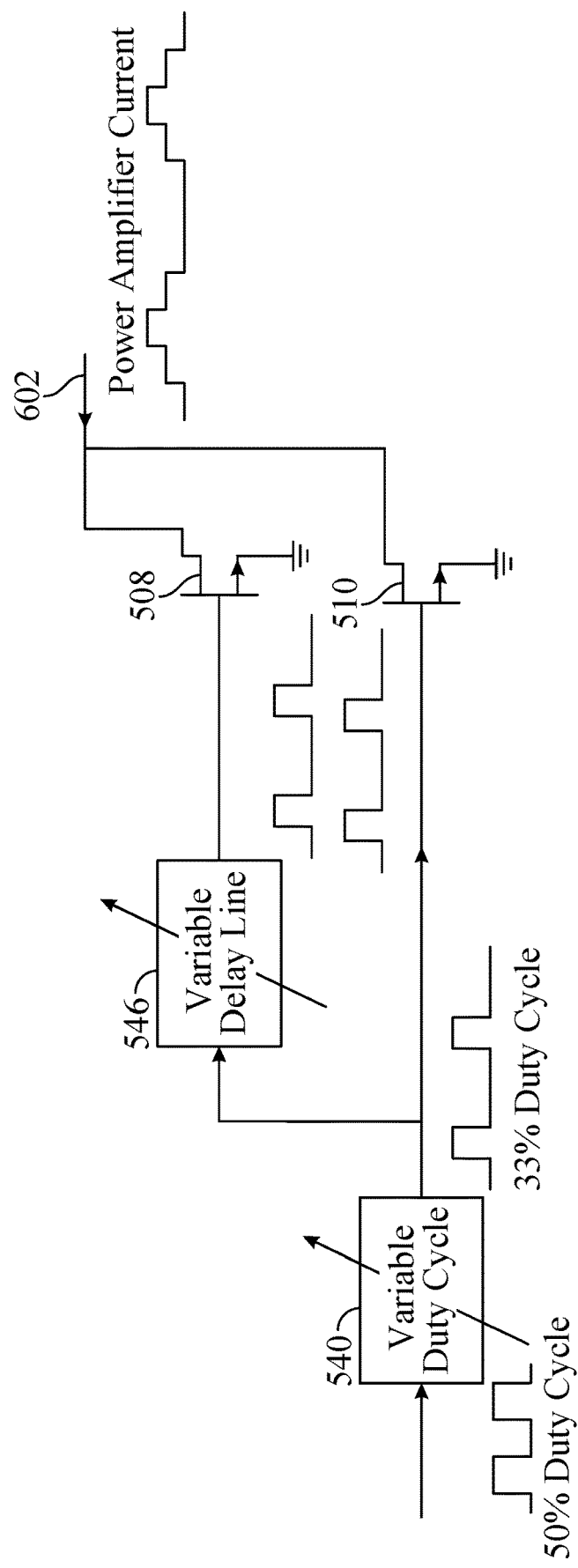
FIG. 6 illustrates an example configuration of a third harmonic cancellation circuit, in accordance with certain aspects of the present disclosure.

FIG. 6 illustrates an example configuration of the third harmonic cancellation circuit 504, in accordance with certain aspects of the present disclosure. As illustrated, the duty cycle control circuit 540 may receive a 50% duty cycle signal and generate a 33% duty cycle signal, which is provided to the gate of the transistor 510. The variable delay circuit 546 may apply a delay to the 33% duty cycle signal and provide the delayed signal to the gate of the transistor 508. The current outputs from the drains of transistors 508, 510 may combine together to produce a linearized current waveform 602 that does not contain any third harmonic content. In this manner, the power amplifier current may be tuned by adjusting the duty cycle control circuit 540 and variable delay circuit 546 to reduce (e.g. minimize) the power of the third harmonic at the output of the PA 506.

In certain aspects, the loopback circuitry may be configured to sense the second harmonic and the third harmonic of the transmission signal 480 during different time periods. For example, during a first time period, the IQ mixer may receive a LO signal having a frequency that is $2f_0$ (e.g., the MUX 422 selects and provides clock signal 427 at $2f_0$ to the IQ mixer), as described herein. Therefore, during the first time period, the output of the IQ mixer is representative of the second harmonic of the transmission signal. During the first period, the DSP 428 may tune the second harmonic cancellation circuit 502, in an attempt to reduce the second harmonic of the transmission signal. During a second time period, the IQ mixer may receive a LO signal having a frequency that is $3f_0$, as described herein. Therefore, during the second time period, the output of the IQ mixer is representative of the third harmonic of the transmission signal. During the second time period, the DSP 428 may tune the third harmonic cancellation circuit 504, in an attempt to reduce the third harmonic of the transmission signal.

Figure 7:
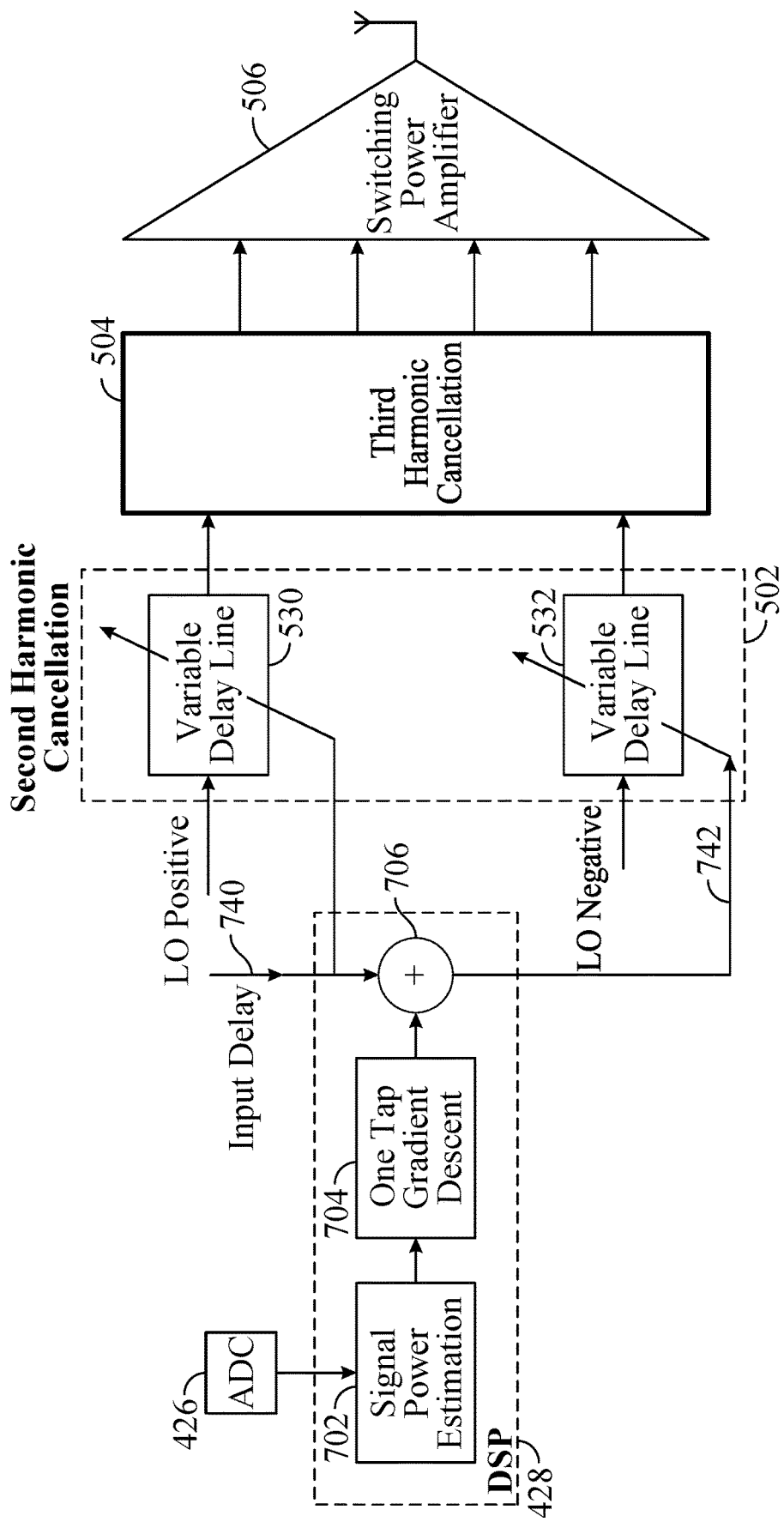
FIG. 7 illustrates an example implementation of a controller for controlling a second harmonic cancellation circuit, in accordance with certain aspects of the present disclosure.

FIG. 7 illustrates an example implementation of the DSP 428 for controlling the second harmonic cancellation circuit 502, in accordance with certain aspects of the present disclosure. As illustrated, the DSP 428 may be implemented with a signal power estimation module 702 that estimates the power of the second harmonic of the transmission signal 480 based on the digital input from the ADC 426. Signal power estimation via the signal power estimation module 702 may be performed by applying a moving average to $I^2+Q^2$, I representing the in-phase data at the output of the ADC 426 and Q representing the quadrature data at the output of the ADC 426. The power estimation may be performed for both continuous wave (CW) and modulated signals.

The estimated power may be input to a one-tap gradient descent module 704, the output of which may be coupled to an input of an adder circuit 706. A gradient descent module implements a gradient descent algorithm for finding the lowest harmonic of the transmission signal by iteratively adjusting the gradient descent module output in a direction of steepest descent of the harmonic. The adder circuit 706 may receive a delay parameter 740 used to set the delay for the variable delay circuit 530. The delay parameter 740 and the output of the one-tap gradient descent module 704 are added via the adder circuit 706 to generate a delay parameter 742 used to set the delay for the variable delay circuit 532. In other words, the output of the one-tap gradient descent module 704 sets the delay difference between the variable delay circuits 530, 532 to reduce the second harmonic of the transmission signal 480.

The one-tap gradient descent algorithm described herein reduces (e.g., minimizes) the power of the second harmonic of the transmission signal by tuning the delay difference between positive and negative LOs in the transmitter. The common value of the delay in positive and negative LOs does not affect the second harmonic power; therefore, the delays in the positive and negative LOs may be set for other purposes in the transceiver. The delay difference between positive and negative LOs in the one-tap gradient descent at sample N may be calculated per the following equation:

$$\text{DelayDiff}(N)=\text{DelayDiff}(N-1)+H2(\text{SigPwr})/(\text{DelayDiff})$$

where DelayDiff(N) is the delay difference between the positive and negative LOs at sample N, H2 is the learning rate for the second harmonic reduction (e.g., minimization), and (SigPwr)/(DelayDiff) is the derivative of the second harmonic power with respect to the delay difference.

Figure 8:
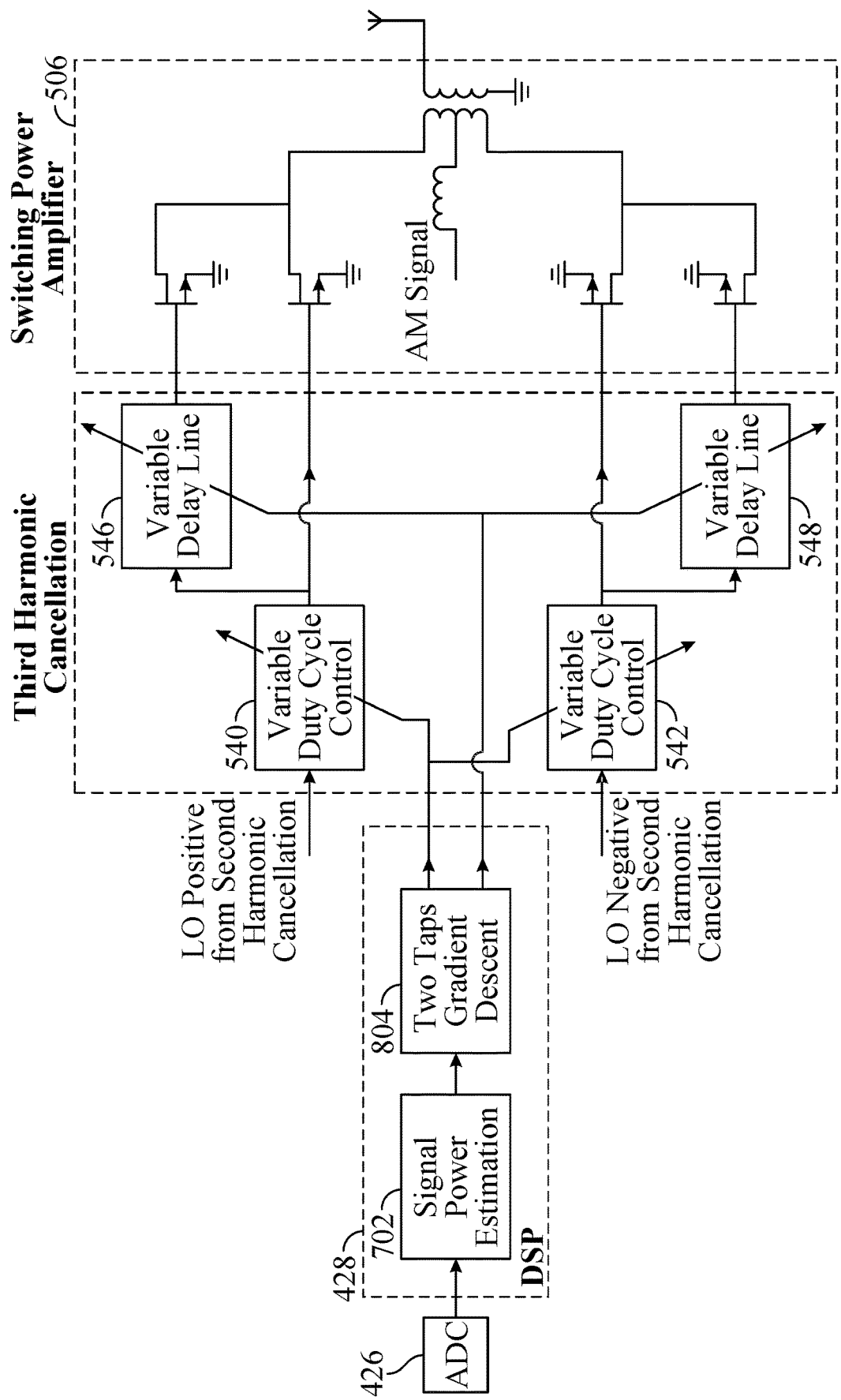
FIG. 8 illustrates an example implementation of a controller for controlling a third harmonic cancellation circuit, in accordance with certain aspects of the present disclosure.

FIG. 8 illustrates an example implementation of the DSP 428 for controlling the third harmonic cancellation circuit 504, in accordance with certain aspects of the present disclosure. As illustrated, the DSP 428 may include a two-tap gradient descent module 804 configured to control each of the duty cycle control circuits 540, 542 and the variable delay circuits 546, 548. The DSP may tune the second and third harmonic cancellation circuits while tracking the harmonic of the transmission signal during the operations of the polar transmitter. The reduction of the second and third harmonics may be performed independently. For instance, the delay circuits for the second harmonic cancellation may be tuned first, followed by tuning of the delay circuits and duty cycle control circuits for cancellation of the third harmonic. To reduce (e.g., minimize) the third harmonic of the polar transmitter, the two-tap gradient descent module may implement a gradient descent algorithm with two taps that may be used to tune the duty cycles and delay values, as described herein, in accordance with the following equations:

$$\text{Delay}(N)=\text{Delay}(N-1)+H31(\text{SigPwr})/(\text{Delay})$$

$$\text{Dutycycle}(N)=\text{Dutycycle}(N-1)+H32(\text{SigPwr})/(\text{Dutycycle})$$

where Delay(N) is the delay value of the variable delay circuits at sample N, Dutycycle(N) is the input value of the duty cycle control circuits at sample N, H31 and H32 are the learning rates of the third harmonic reduction (e.g., minimization), (SigPwr)/(Delay) is the derivative of the third harmonic power with respect to delay, and (SigPwr)/(Dutycycle) is the derivative of the third harmonic power with respect to duty cycle.

While the examples described herein have described a DSP for tuning the harmonic cancellation circuits to facilitate understanding, any circuitry or firmware may be used as a controller for tuning of the harmonic cancellation circuits. Moreover, as used herein, the term "cancellation" of a harmonic should not be interpreted as requiring complete cancellation of the harmonic to zero power. Rather, a harmonic cancellation circuit generally refers to any circuit that is configured to at least reduce a harmonic of a signal (e.g., transmission signal 480).

The polar transmitter described herein cancels the harmonics of the transmission signal, allowing for removal (or size reduction) of filters at the output of the polar transmitter, reducing power consumption, area, and cost, while solving the fundamental problem of harmonic interference in multiband wireless systems such as WiFi and Bluetooth. Furthermore, by eliminating (or at least reducing) the source of harmonic non-linearity on-chip, the harmonics at the antenna of the final product (e.g., wireless device) are less dependent on board impedances and radio-frequency (RF) grounding of the implementation, which makes integrated circuit (IC) products easier for customers to integrate and take to production.

Figure 9:
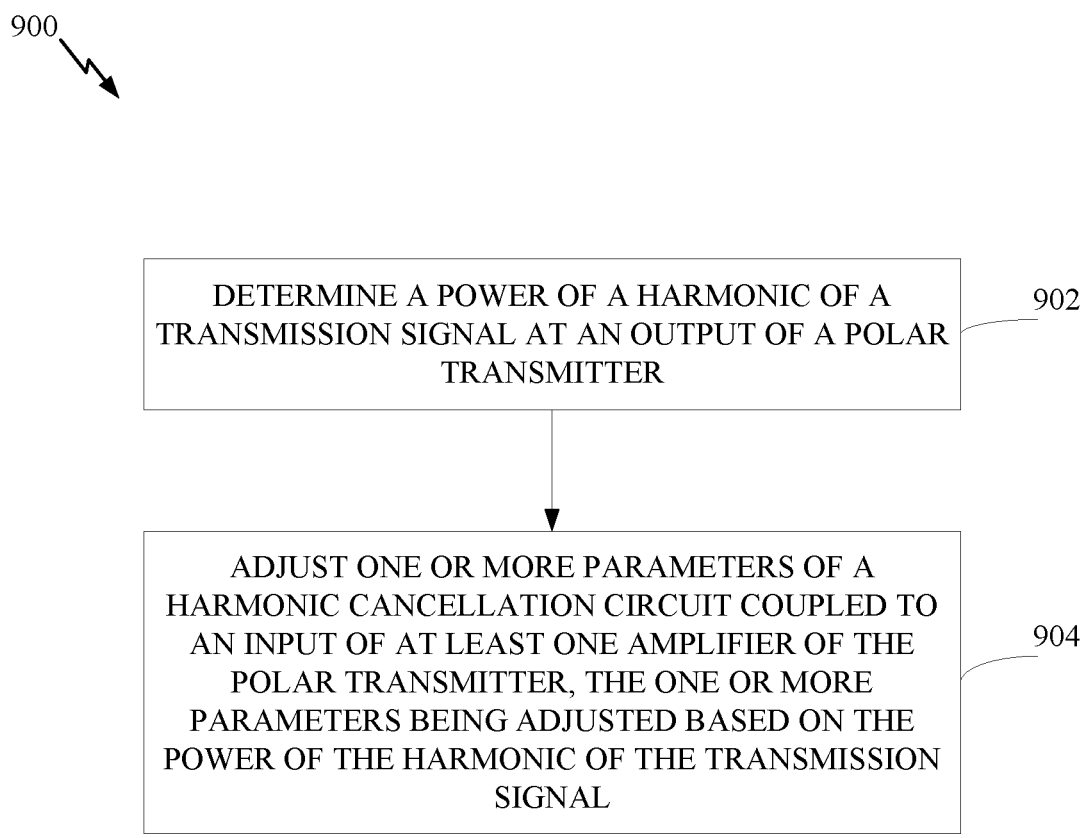
FIG. 9 is a flow diagram illustrating example operations for wireless communication, in accordance with certain aspects of the present disclosure.

FIG. 9 is a flow diagram illustrating example operations 900 for wireless communication, in accordance with certain aspects of the present disclosure. The operations 900 may be performed by a polar transmitter, such as the polar transmitter 400.

The operations 900 begin, at block 902, with the polar transmitter determining a power of a harmonic of a transmission signal (e.g., transmission signal 480) at an output of the polar transmitter, and at block 904, adjusting one or more parameters of a harmonic cancellation circuit coupled to an input of an amplifier of the polar transmitter. In certain aspects, the one or more parameters may be adjusted based on the power of the harmonic of the transmission signal.

In certain aspects, the at least one amplifier may include a first amplifier (e.g., transistor 510) and a second amplifier (e.g., transistor 512). Adjusting the one or more parameters may include at least one of adjusting a delay associated with a first variable delay circuit (e.g., variable delay circuit 530) coupled to an input of the first amplifier, and adjusting a delay associated with a second variable delay circuit (e.g., variable delay circuit 532) coupled to an input of the second amplifier. In certain aspects, the first amplifier may be coupled to a first terminal of a primary winding (e.g., primary winding 516) of a transformer and the second amplifier may be coupled to a second terminal of the primary winding.

In certain aspects, the at least one amplifier may include a first amplifier (e.g., transistor 510) and a second amplifier (e.g., transistor 508). Adjusting the one or more parameters may include at least one of adjusting a duty cycle associated with a duty cycle control circuit (e.g., duty cycle control circuit 540) coupled to an input of the first amplifier, and adjusting a delay associated with a variable delay circuit (e.g., variable delay circuit 546) coupled between an output of the duty cycle control circuit and an input of the second amplifier. In certain aspects, the first amplifier and the second amplifier may be coupled to a terminal (the same terminal) of a primary winding of a transformer.

In certain aspects, determining the power of the harmonic may include downconverting (e.g., via the IQ mixer 418) a harmonic of the transmission signal to generate a baseband signal that is representative of the power of the harmonic. The harmonic of the transmission signal may be downconverted based on a LO signal generated based on an input signal of the polar transmitter. For example, the polar transmitter may select (e.g., via MUX 422) one of a first LO signal (e.g., clock signal 404) and a second LO signal (e.g., clock signal 427), the harmonic of the transmission signal being downconverted based on the selected one of the first LO signal and the second LO signal. In certain aspects, the first LO signal has a frequency that is twice a fundamental frequency of the polar transmitter, and the second LO signal has a frequency that is three times the fundamental frequency of the polar transmitter. Thus, the baseband signal may be representative of a second harmonic of the transmission signal if the selected one of the first LO signal and the second LO signal comprises the first LO signal, and may be representative of a third harmonic of the transmission signal if the selected one of the first LO signal and the second LO signal comprises the second LO signal.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features, and/or functions illustrated herein may be rearranged and/or combined into a single component, step, feature, or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for determining may include a mixer, such as the IQ mixer 418. Means for adjusting may include a controller, such as the DSP 428. Means for amplifying may include an amplifier, such as the switching PA 506.

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. A polar transmitter comprising:
   at least one amplifier having an input configured to receive a phase-modulated signal to be amplified based on an amplitude-modulated signal;
   a harmonic cancellation circuit coupled to the input of the at least one amplifier, the harmonic cancellation circuit being configured to cancel at least one of an even harmonic or an odd harmonic of a transmission signal at an output of the polar transmitter;
   a controller having an output coupled to one or more control inputs of the harmonic cancellation circuit; and
   a feedback path between an output of the at least one amplifier and an input of the controller.

2. The polar transmitter of claim 1, wherein the even harmonic comprises a second harmonic of the transmission signal, and wherein the odd harmonic comprises a third harmonic of the transmission signal.

3. The polar transmitter of claim 1, wherein the at least one amplifier comprises a differential amplifier, and wherein the harmonic cancellation circuit comprises a first variable delay circuit coupled to a positive input terminal of the differential amplifier and a second variable delay circuit coupled to a negative input terminal of the differential amplifier, the one or more control inputs comprising control inputs of the first variable delay circuit and the second variable delay circuit.

4. The polar transmitter of claim 3, further comprising a transformer having a primary winding and a secondary winding, wherein a positive output terminal of the differential amplifier is coupled to a first terminal of the primary winding and a negative output terminal of the differential amplifier is coupled to a second terminal of the primary winding.

5. The polar transmitter of claim 1, wherein the at least one amplifier comprises a first amplifier and a second amplifier, an output of the first amplifier being coupled to an output of the second amplifier, wherein the harmonic cancellation circuit comprises a duty cycle control circuit coupled to the input of the first amplifier and a variable delay circuit coupled between an output of the duty cycle control circuit and the input of the second amplifier, the one or more control inputs comprising control inputs of the variable delay circuit and the duty cycle control circuit.

6. The polar transmitter of claim 5, further comprising a transformer having a primary winding and a secondary winding, wherein the outputs of the first amplifier and the second amplifier are coupled to a terminal of the primary winding, wherein the at least one amplifier further comprises a third amplifier and a fourth amplifier having outputs coupled to another terminal of the primary winding.

7. The polar transmitter of claim 5, wherein the at least one amplifier further comprises a third amplifier, the third amplifier and the first amplifier forming a differential amplifier, and wherein the harmonic cancellation circuit comprises a first variable delay circuit coupled to a positive input terminal of the differential amplifier and a second variable delay circuit coupled to a negative input terminal of the differential amplifier, the one or more control inputs further comprising control inputs of the first variable delay circuit and the second variable delay circuit.

8. The polar transmitter of claim 1, wherein the feedback path comprises a mixer having a first input coupled to the output of the amplifier and an output coupled to the input of the controller.

9. The polar transmitter of claim 8, further comprising an attenuator coupled between the first input of the mixer and the output of the amplifier.

10. The polar transmitter of claim 8, wherein a second input of the mixer is coupled to an input node of the polar transmitter.

11. The polar transmitter of claim 10, further comprising:
    a clock generator configured to generate an input signal at the input node; and
    a frequency divider having an input coupled to an output of the clock generator and at least one output coupled to the harmonic cancellation circuit.

12. The polar transmitter of claim 8, wherein the mixer is configured to downconvert a harmonic of a transmission signal at the output of the amplifier to generate a baseband signal that is representative of a harmonic of the transmission signal, the controller being configured to set one or more parameters of the harmonic cancellation circuit based on the baseband signal.

13. The polar transmitter of claim 8, further comprising a multiplexer configured to select one of a first local oscillator (LO) signal and a second LO signal and provide the selected one of the first LO signal and the second LO signal to a second input of the mixer.

14. The polar transmitter of claim 13, wherein the first LO signal has a frequency that is twice a fundamental frequency of the polar transmitter, and wherein the second LO signal has a frequency that is three times the fundamental frequency of the polar transmitter.

15. The polar transmitter of claim 14, wherein:
    the mixer is configured to downconvert a harmonic of a transmission signal at the output of the amplifier to generate a baseband signal, the controller being configured to set one or more parameters of the harmonic cancellation circuit based on the baseband signal; and
    the baseband signal is representative of a second harmonic of the transmission signal if the first LO signal is selected by the multiplexer or representative of a third harmonic of the transmission signal if the second LO signal is selected by the multiplexer.

16. A polar transmitter comprising:
    a first amplifier;
    a second amplifier, each of the first amplifier and the second amplifier having an input configured to receive a phase-modulated signal to be amplified based on an amplitude-modulated signal; and
    a harmonic cancellation circuit configured to cancel an odd harmonic of a transmission signal at an output of the polar transmitter, the harmonic cancellation circuit comprising:
       a duty cycle control circuit coupled to the input of the first amplifier; and
       a variable delay circuit coupled between an output of the duty cycle control circuit and an input of the second amplifier.

17. The polar transmitter of claim 16, further comprising a transformer, wherein the first amplifier is coupled to a first terminal of a primary winding of the transformer and the second amplifier is coupled to the first terminal of the primary winding.

18. The polar transmitter of claim 17, further comprising a third amplifier coupled to a second terminal of the primary winding, and a fourth amplifier coupled to the second terminal of the primary winding.

19. The polar transmitter of claim 18, wherein the harmonic cancellation circuit further comprises:
another duty cycle control circuit coupled to an input of the third amplifier; and
another variable delay circuit coupled between an output of the other duty cycle control circuit and an input of the fourth amplifier.

20. The polar transmitter of claim 19, further comprising another harmonic cancellation circuit having:
a variable delay circuit coupled to an input of the duty cycle control circuit of the harmonic cancellation circuit; and
another variable delay circuit coupled to an input of the other duty cycle control circuit of the harmonic cancellation circuit.

21. A method for wireless communication, comprising:
determining a power of a harmonic of a transmission signal at an output of a polar transmitter; and
adjusting one or more parameters of a harmonic cancellation circuit coupled to an input of at least one amplifier of the polar transmitter, the one or more parameters being adjusted based on the power of the harmonic of the transmission signal.

22. The method of claim 21, wherein the at least one amplifier comprises a first amplifier and a second amplifier, and wherein adjusting the one or more parameters comprises at least one of:
adjusting a delay associated with a first variable delay circuit coupled to the input of the first amplifier; and
adjusting a delay associated with a second variable delay circuit coupled to the input of the second amplifier.

23. The method of claim 22, wherein the first amplifier is coupled to a first terminal of a primary winding of a transformer and the second amplifier is coupled to a second terminal of the primary winding.

24. The method of claim 21, wherein the at least one amplifier comprises a first amplifier and a second amplifier, and wherein adjusting the one or more parameters comprises at least one of:

adjusting a duty cycle associated with a duty cycle control circuit coupled to an input of the first amplifier; and
adjusting a delay associated with a variable delay circuit coupled between an output of the duty cycle control circuit and an input of the second amplifier.

25. The method of claim 24, wherein the first amplifier and the second amplifier are coupled to a terminal of a primary winding of a transformer.

26. The method of claim 21, wherein determining the power of the harmonic comprises downconverting a harmonic of the transmission signal to generate a baseband signal that is representative of the power of the harmonic.

27. The method of claim 26, wherein the harmonic of the transmission signal is downconverted based on a local oscillator (LO) signal generated based on an input signal of the polar transmitter.

28. The method of claim 26, further comprising selecting one of a first local oscillator (LO) signal and a second LO signal, the harmonic of the transmission signal being downconverted based on the selected one of the first LO signal and the second LO signal.

29. The method of claim 28, wherein the first LO signal has a frequency that is twice a fundamental frequency of the polar transmitter, and wherein the second LO signal has a frequency that is three times the fundamental frequency of the polar transmitter.

30. An apparatus for wireless communication, comprising:
means for determining a power of a harmonic component of a transmission signal at an output of a polar transmitter; and
means for adjusting one or more parameters of a harmonic cancellation circuit coupled to an input of a means for amplifying of the polar transmitter, the one or more parameters being adjusted based on the power of the harmonic component.

* * * * *